United States Patent
Becker et al.

(10) Patent No.: US 8,227,772 B2
(45) Date of Patent: Jul. 24, 2012

(54) CONDUCTIVE CONTAMINATION RESISTANT INSULATOR

(75) Inventors: Klaus Becker, Kensington, NH (US); Daniel Alvarado, Methuen, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 467 days.

(21) Appl. No.: 12/612,117

(22) Filed: Nov. 4, 2009

(65) Prior Publication Data

US 2010/0108915 A1 May 6, 2010

Related U.S. Application Data

(60) Provisional application No. 61/111,949, filed on Nov. 6, 2008.

(51) Int. Cl.
*H01L 21/265* (2006.01)
(52) U.S. Cl. ................ 250/492.2; 250/492.1; 250/492.3
(58) Field of Classification Search ..... 250/492.1–492.3
See application file for complete search history.

(56) References Cited

U.S. PATENT DOCUMENTS 6,683,317 B1 * 1/2004 Simmons et al. ........ 250/492.21
2002/0158213 A1 10/2002 Matsunaga et al.

FOREIGN PATENT DOCUMENTS

JP H06-231712 A 8/1994

\* cited by examiner

*Primary Examiner* — Michael Maskell

(57) ABSTRACT

An apparatus that forms a source bushing, while comprehending the possible formation of electrically conductive films thereon, is disclosed. Such an apparatus may advantageously be used to isolate an ion source from other components within the ion implanter, as these components may be at different electrical potentials. In one embodiment, the source bushing is constructed from a material having a lower electrical resistance than is currently used. By constructing the bushing in this manner, the effects of the applied lower resistance films is reduced, as the change in effective resistance is reduced. In other embodiments, the source bushing is purposely lined with an electrically semiconducting material, so that the effects of the later applied lining are minimized. In either case, the electrical potential between the two devices that are being isolated by the bushing is more evenly applied across the bushing.

13 Claims, 5 Drawing Sheets

CONDUCTIVE CONTAMINATION RESISTANT INSULATOR

This application claims priority of U.S. Provisional Patent Application No. 61/111,949, filed Nov. 6, 2008, the disclosure of which is herein incorporated by reference in its entirety.

FIELD

This disclosure relates to insulators, and more particularly to a conductive contamination resistant insulator.

BACKGROUND

Insulators are used in many different applications. Typically, they are used to separate regions or components having different electrical potentials. In one application, an insulator (which may be referred to herein as a "source bushing") may be used to electrically insulate an ion source from other components of an ion implanter. An ion source is a critical component of an ion implanter. The ion source generates an ion beam, which passes through the beamline of the ion implanter and is delivered to a target workpiece such as a semiconductor wafer. In order to generate this ion beam, the ion source is typically biased at a voltage significantly higher than the surrounding components, such as 80 kV. The ion source is required to generate a stable, well-defined ion beam for a variety of different ion species and extraction voltages. It is desirable to operate the ion source in a production facility for extended periods of time without the need for maintenance or repair.

To electrically insulate the ion source from the remaining components, an insulator, such as a source bushing is used to separate the components. Typically, a source bushing made using materials having an extremely higher resistivity, such as epoxy resin with ceramic filler. Such a material may have a resistance of greater than 50 GΩ (Giga Ohms) between the ion source and the grounded attached components.

An ion source typically generates an ion beam by ionizing within an arc chamber a dopant gas containing a desired dopant element. The ion beam is extracted through an extraction aperture of the ion source by an extraction electrode located proximate the extraction aperture. Different dopant gases are selected in response to the desired dopant element. Some dopant gases are fluorine containing gases such as boron trifluoride ($BF_3$), germanium tetrafluoride ($GeF_4$), and silicon tetrafluoride ($SiF_4$). Because of the temperatures, voltages and ions to which it is exposed, tungsten is typically used to construct the ion chamber.

While tungsten is an excellent material to use for the ion chamber, it does tend to react with fluorine, especially after prolonged exposure, according to the equation:

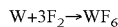

$$W + 3F_2 \rightarrow WF_6$$

Tungsten hexafluoride is a gaseous compound that can permeate the region in communication with the ion source. Consequently, a drawback with a conventional ion implanter utilizing fluorine containing dopant gases such as $BF_3$, $GeF_4$, and $SiF_4$ is that conductive tungsten films may form on the source bushing. For example, a conductive tungsten film forms on the source bushing when the dopant gas is $BF_3$, since fluorine creates $WF_6$ gas in the ion source, which selectively chemically attacks the source bushing material. The tungsten film grows from one end of the source bushing and after a short time (which could be on the order of about 40 to 100 hours) could lead to electrical breakdown across the uncoated end of the source bushing.

FIG. 7 shows a simplified cross sectional view of an ion source 700, a source bushing 701 and a component 702. The component 702 may be a mounting flange or vacuum chamber, and may be made of an electrical conductive material, such as a metal or metal alloy. The component 702 is at a different electrical potential than the ion source 700, and in some embodiments, is grounded. In some embodiments, a metal shield 703 is attached to the component 702, so as to minimize electrical fields created by the ion source 700. The source bushing 701 may have one or more convolutions formed therein. These convolutions increase the surface creep path and break down voltage along the bushing (701) between the ion source (700) and component (702), on both the atmosphere and vacuum sides. In some embodiments, gases from the ion source 700, such as $WF_6$, emerge from the ion source 700 and pass through the gap 705 between the ion source 700 and the shield 703. Tungsten hexafluoride is relatively non-reactive with metal, and therefore migrates toward the source bushing 701, which may be made using epoxy. Due to higher chemical reactivity of the epoxy, the gas chemically interacts with the bushing 701 and begins to form a film 710, starting near the ion source 700 and extending toward the component 702 (i.e. moving from left to right in FIG. 7). This film 710 has a lower resistance than the source bushing 701, and therefore affects the distribution of the voltage potential across the bushing 701.

FIG. 1 is an equivalent circuit diagram to illustrate drawbacks of a conventional source bushing having a partial coating of a tungsten film. Although this disclosure describes the film as being of tungsten, other materials can also form a conductive layer on the insulator. These materials include other metals, water or moisture. The electrical model example of FIG. 1 is based on actual measurements from a failed source bushing, which had an applied film as shown in FIG. 7. The source bushing has four convolutions, such as is shown in FIG. 7. In this embodiment and that of FIG. 5, the term "convolution" is used to describe the protrusions on the vacuum side of the source bushing. Thus, FIGS. 5 and 7 show a bushing having four convolutions. In contrast, the bushing of FIG. 3 has three convolutions, in the conventional sense. As seen in FIG. 7, the film grows so as to cover three of the four convolutions. Typically, once the film has reached point 711, arcing will begin to occur. The electrical resistance of this tungsten film is about 1.5 GΩ (Giga Ohms), which is relatively low compared to the surface resistance of the remaining electrical gap in the creepage path along the bushing surface (>20 GΩ). This creepage path is defined by the bushing surface between point of arcing 711 and the component 702, and is the portion of the bushing that remain uncoated when the arcing occurs. Therefore, the tungsten film and the remaining uncoated source bushing form a voltage divider, which applies nearly all of the extraction voltage across the uncoated part of the source bushing. For example, when the extraction voltage is 80 kilovolts (kV), nearly all (or >74 kV) of the 80 kV extraction voltage is applied across the uncoated part of the bushing. It can be seen, using these ratios, that more than 91% (or about 20 GΩ/21.5 GΩ) of the voltage is applied across the uncoated portion of the source bushing. This implies that point 711 is at 74 kV, where nearby components, such as shield 703 and component 702 are at ground. This large potential over such a small region can lead to arcing and electrical breakdown of the source bushing. As the film 710 approaches the component 702, there are multiple arc discharge paths that develop. Typically, as the film grows, it reaches a convolution point 711. Due to the shape of the bushing 701, arcing is more likely to originate at one of the points on the bushing. In one embodiment, the voltage arcs from point 711 to the tip of shield 703, as shown by dotted line 714. In another embodiment, the voltage arcs from point 711 to the extending point on the grounded component 702, such as a screw or fastener, as shown by dotted line 715. Once arcing begins, the ion implanter must be taken offline, so that the source bushing 702 can be replaced.

Accordingly, there is a need for an improved source bushing configuration which overcomes the above-described inadequacies and shortcomings. A source bushing, designed with the knowledge that a conductive film may develop on it, would be beneficial in these applications so as to prevent arcing and electrical discharge. Furthermore, it would improve the operational time (i.e. uptime) of the ion implanter, especially when fluorine-based gases are being used.

SUMMARY

An apparatus that forms a source bushing, while comprehending the possible formation of electrically conductive films thereon, is disclosed. Such an apparatus may advantageously be used to isolate an ion source from other components within the ion implanter, as these components may be at different electrical potentials. By preventing unwanted electrical discharge, the ion implanter may perform longer without need for preventative maintenance or repair.

In one embodiment, the source bushing is constructed from a material having a lower electrical resistance than is currently used. By constructing the bushing in this manner, the effects of the applied lower resistance films is reduced, as the change in effective resistance is reduced. In other embodiments, the source bushing is purposely lined with an electrically semiconducting material, so that the effects of the later applied lining are minimized. In either case, the electrical potential between the two devices that are being isolated by the bushing is more evenly applied across the bushing.

BRIEF DESCRIPTION OF THE DRAWINGS

For a better understanding of the present disclosure, reference is made to the accompanying drawings, in which like elements are referenced with like numerals, and in which.

DETAILED DESCRIPTION

In general, the present disclosure is directed at a source bushing and compensating for the growth of film, such as a tungsten film, on the source bushing to minimize arcing and/or electrical breakdown of the source bushing.

Figure 2:
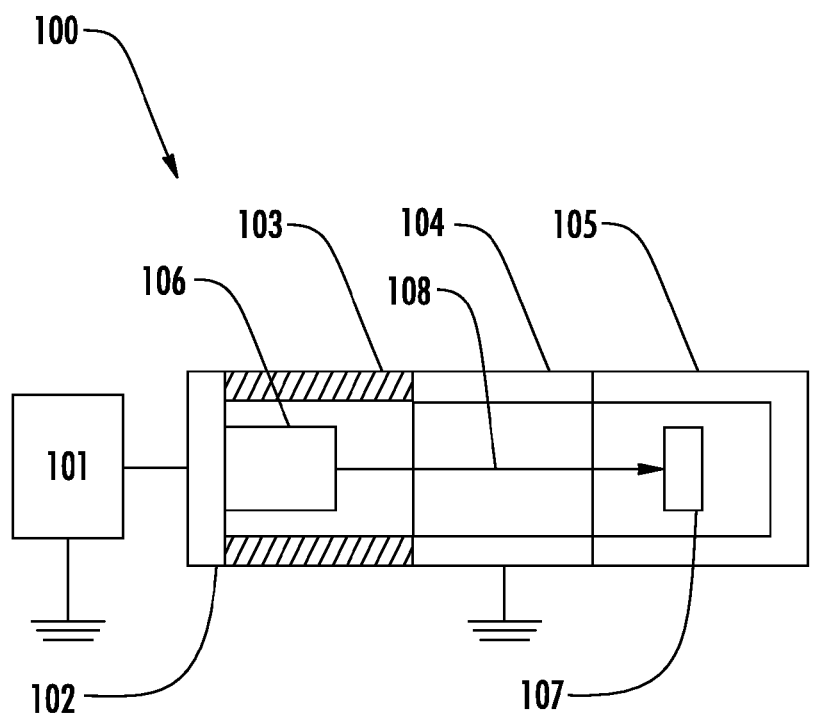
FIG. 2 is a simplified block diagram of an ion implanter having an ion source and a source bushing consistent with an embodiment of the present disclosure.

Turning to FIG. 2, a simplified block diagram of an ion implanter 100 is illustrated. The ion implanter 100 includes a high voltage supply 101, source flange 102, ion source bushing 103, beamline 104, end station 105 and ion source 106. The walls of items 102 to 105 form a vacuum tight vessel that encloses ion source 106 and one or more work pieces 107 in end station 105. Ion source 106 generates ion beam 108 which is directed via beamline 104 to workpiece 107. Ion beam 108 is accelerated by the electrostatic high voltage potential that power supply 101 creates between ion source 106 and earth ground at beamline 104, end station 105 and work piece 107. Source bushing 103 provides electrical isolation between flange 102 and beamline 104 which prevents shorting of power supply 101.

The beam line components 104 may include components known to those skilled in art to control and direct the ion beam 108 towards the workpiece 107. Some examples of such beam line components 104 include, but are not limited to, a mass analyzing magnet, a resolving aperture, ion beam acceleration and/or deceleration columns, a collimator magnet, lenses, and electrodes. Those skilled in the art will recognize alternative and/or additional beam line components 104 that may be utilized in the ion implanter 100.

The end station 105 supports one or more workpieces, such as workpiece 107, in the path of ion beam 108 such that ions of the desired species are implanted into workpiece 107. The workpiece 107 may be, for example, a semiconductor wafer or another object requiring ion implantation. The end station 105 may include a platen (not illustrated) to support the workpiece 107. The platen may secure the workpiece 107 using electrostatic forces. The end station 105 may also include a scanner (not illustrated) for moving the workpiece 110 in a desired direction.

The end station 105 may also include additional components known to those skilled in the art. For example, the end station 105 typically includes automated workpiece handling equipment for introducing workpieces into the ion implanter 100 and for removing workpieces after ion implantation. It will be understood to those skilled in the art that the entire path traversed by the ion beam is evacuated during ion implantation. The ion implanter 100 may also have a controller (not illustrated) to control a variety of subsystems and components of the ion implanter 100.

The source bushing 103 may be coupled between the ion source 102 and other components of the ion implanter such as a vacuum vessel. The two termini of the bushing are maintained at different electrical potentials. For example, the ion source may be energized to a high extraction potential of about 80 kV in some instances and even higher in other instances by an extraction power supply (not illustrated). The other terminus of the source bushing 103 may be coupled to a component at ground potential. Advantageously, the source bushing 103 is configured to compensate for the growth of an electrically conductive film, such as a tungsten film, on the source bushing 103 to minimize electrical breakdown of the source bushing.

Throughout this disclosure, the term "tungsten film" is used to describe a film that adheres to the source bushing during the operation of the ion implanter 100. This tungsten film has a much lower electrical resistance than the conventional bulk material used to construct the source bushing. "Much lower" is defined as more than ten times less resistance.

In a first embodiment, the bulk material of the source bushing 103 may be modified by additives to give the bulk material a limited conductivity. For example, it is customary to use alumina ($Al_2O_3$) at high concentrations to form an insulator. Pure alumina is a very good insulator, but dopants can give it sufficient conductivity to control the resistance of the bushing by introducing a current path through the grains of alumina. In other embodiments, a more conductive additive, such as a semiconducting compound, or silver or graphite powder, may be added in low concentrations to modify the resistance of the bushing by forming a current path that bypasses the alumina and epoxy. Semiconductors may be defined as that class of materials having a bulk resistance below 1E3 ohm-cm. Any semiconductor may be used as the conductive additive described above. In addition, there are other semiconducting materials with high resistivity that could also be used, such as Tungsten-Carbide or Gallium-Arsenide. This class of materials may be referred to as semi-insulators, indicating a bulk resistance from 1E3 to 1E10 ohm-cm. Other materials in this class can also be used as the additive. In yet other embodiments, an organo-metallic material may be added. A suitable organo-metallic substance must be tailored to the specific epoxy. The organo-metallic substances impart conductivity to the epoxy itself with conduction at the molecular level. This is different from the methods described above, which create current paths that bypass the epoxy through connected grains. In practice, the source bushing is made using a mold. Material, such as epoxy, is mixed with an appropriate additive (to achieve the desired resistance), so as to create a nearly homogeneous mixture. This mixture is then poured into the mold where it is hardened, such as by heating, into a source bushing. Other methods of creating an epoxy-based insulator are also known and are within the scope of this disclosure.

Figure 6:
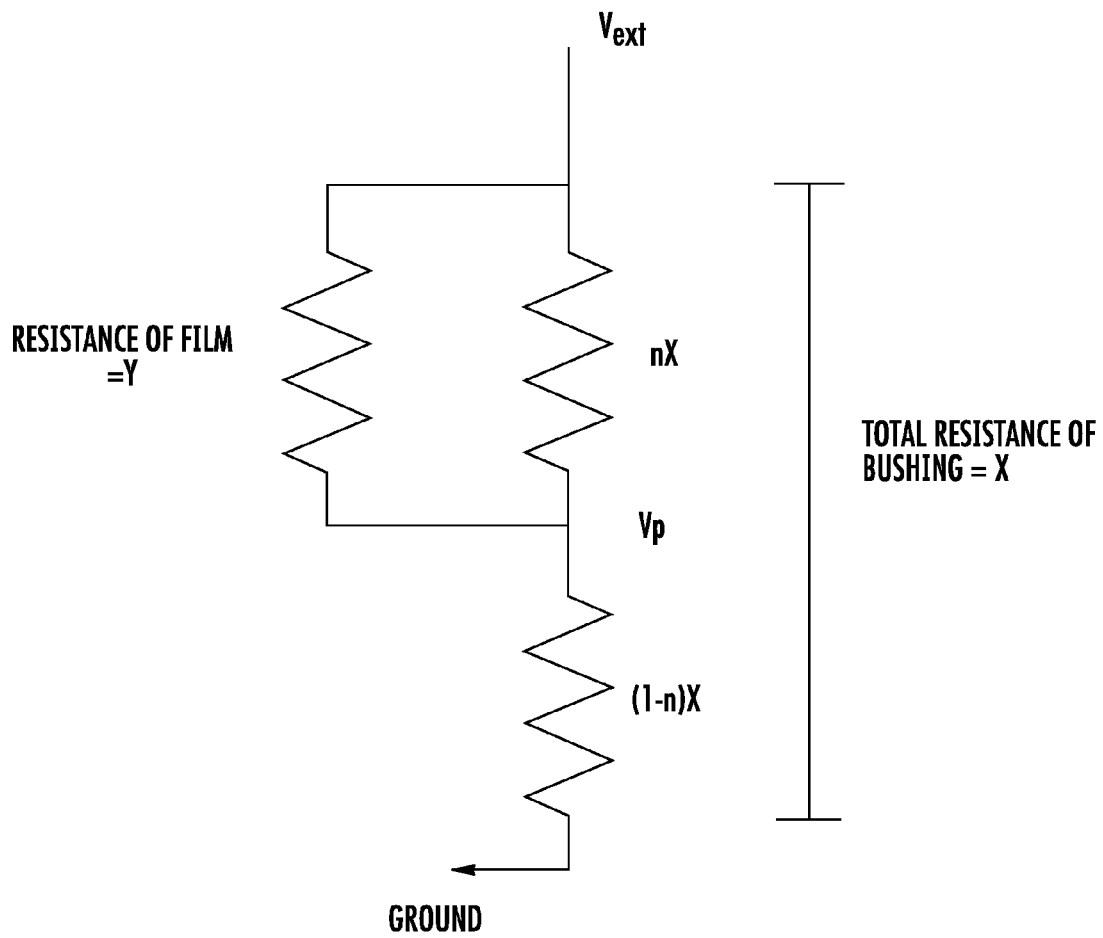
FIG. 6 is a general circuit diagram to illustrate characteristics of a source bushing consistent with the present disclosure.

Since the insulator connects components or devices at different potentials, a lower resistance value will increase the flow of current between the component of higher potential and that of lower potential. For example, as stated earlier, the ion source may be at 80 kV, while the other component, such as a vacuum element, may be at ground potential. If the insulator has an overall resistance of 1 MΩ, the power supply generating the 80 kV potential for the ion source will have to provide an additional 80 mA to account for the flow of current through the insulator. Therefore, the resistance of the bulk material may preferably be high enough so that the additional load on the extraction power supply is insignificant, but small enough compared to the resistance of the developing film, so that the strength of electric fields across the surface of the bushing and surrounding space stays within safe limits at all times. Commonly accepted safe values for these limits for a source bushing operating in an ion implanter, are 10 kV/inch across the surface and 85 kV/inch across the interface between bushing and vacuum. These values include safety margins and an actual design may use higher or lower limits depending on required reliability. In order to minimize the load on the power supply, a specific bushing design should make the bulk resistance of the bushing as high as possible while staying below these safe limits for the expected film growth under worst case conditions. FIG. 6 gives the equation that relates bushing resistance (X), film resistance (Y), resistance of bushing section covered by film (nX), high voltage potential across the bushing (Vext), and high voltage potential (Vp) at the edge of the growing film. With knowledge of the equation shown in FIG. 6 and the desired geometry of the ion source assembly those skilled in the art can derive the maximum value for the bushing resistance X at which the bushing is still compliant with the limits of 10 kV/inch across the surface and 85 kV/inch across the interface between bushing and vacuum. This maximum value for X is the ideal resistance for the specific design In some embodiments, the deposited film has a resistance of 1 GΩ or greater, and the bulk material of the source bushing has a resistance of between 1 and 100 MΩ. In other embodiments, the source bushing may have a resistance as high as 4 GΩ. Advantageously, a growing tungsten film does not significantly affect the potential distribution across the bushing and therefore limits and/or prevents arcing that may otherwise occur over the last, uncoated portion of the source bushing.

Figure 3:
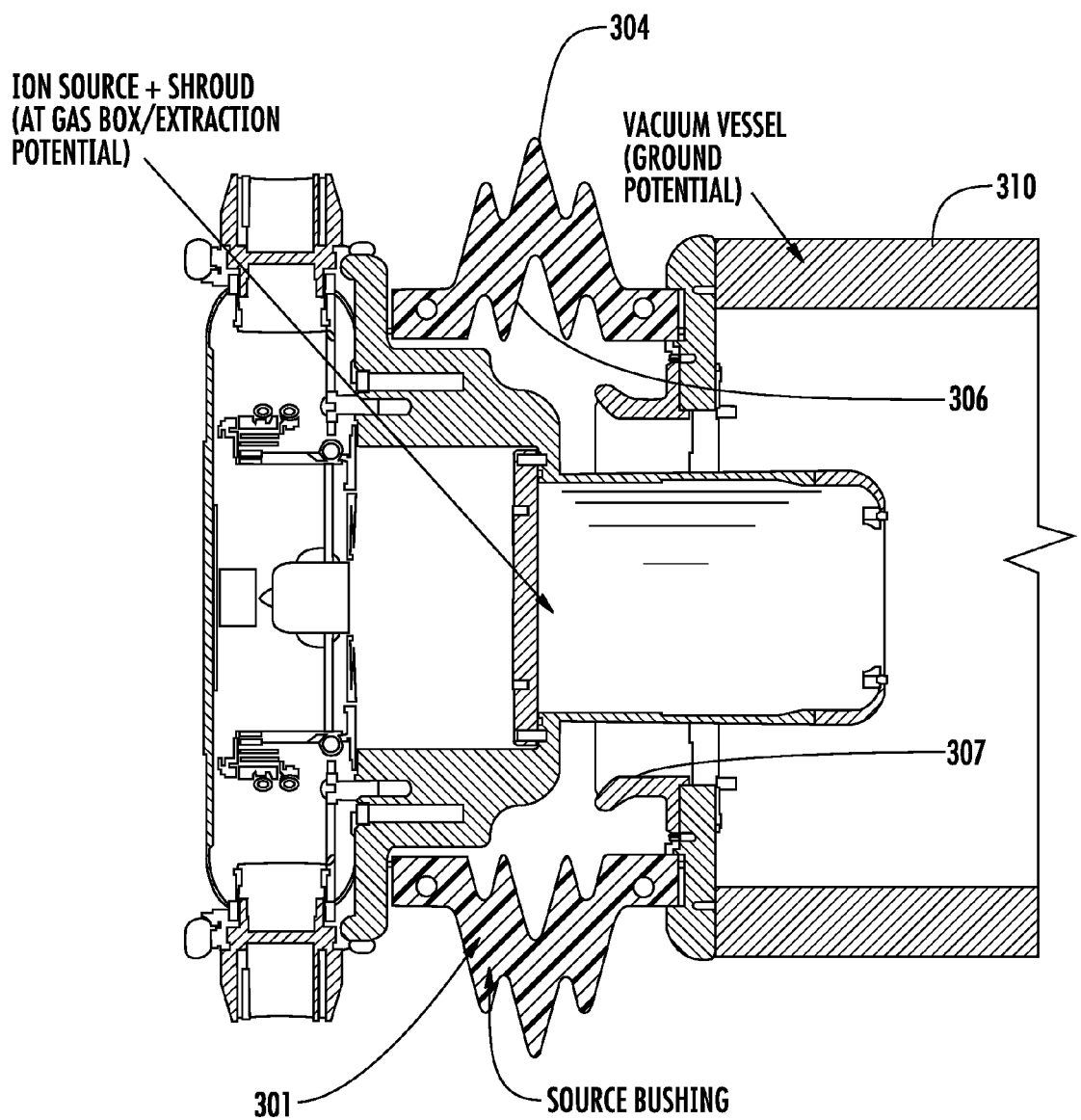
FIG. 3 is a cross sectional view of a source bushing consistent with an embodiment of the present disclosure.
Figure 7:
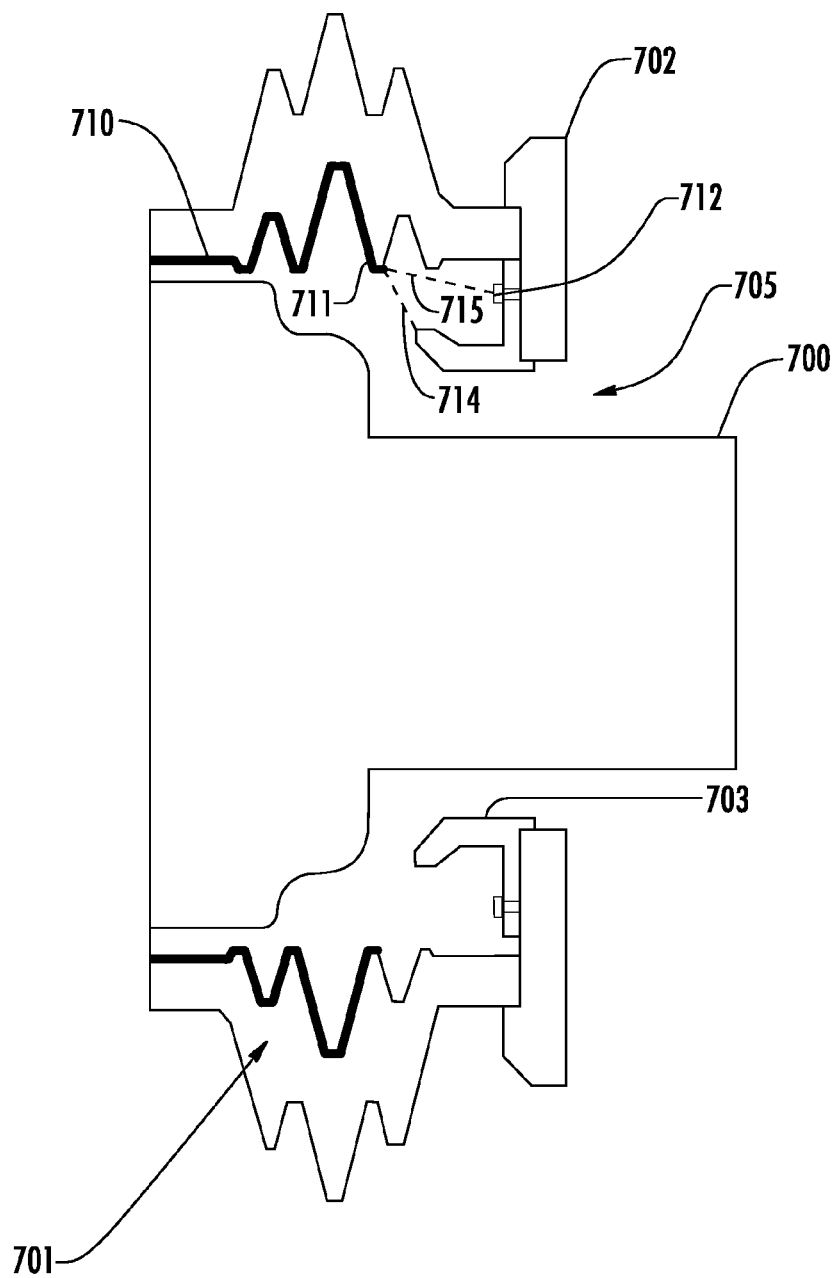
FIG. 7 is a simplified cross sectional view of a conventional source bushing and ion source.

FIG. 3 is a more detailed cross sectional view of one source bushing 301 in more detail. The source bushing 301 may have an annular shape and be coupled between an ion source at an extraction potential and a vacuum vessel 310 at ground potential. The source bushing 301 has a vacuum side 306 and at atmosphere side 304. A tungsten film (not illustrated in FIG. 3) may form on the vacuum side 306 of the source bushing 301, as explained in reference to FIG. 7. In addition, there may be an electrical shield 307, attached to the vacuum vessel 310. The source bushing 301 may have a bulk material modified by additives to give the bulk material a limited conductivity consistent with the first embodiment or have a conductive liner on the vacuum side 306 of the source bushing consistent with the second embodiment of FIG. 5.

Figure 1:
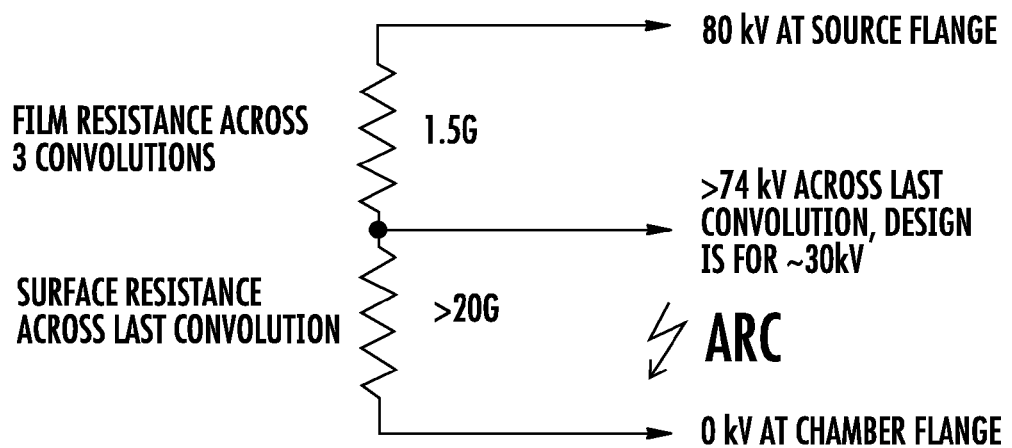
FIG. 1 is a circuit diagram to illustrate a drawback of a conventional source bushing.
Figure 4:
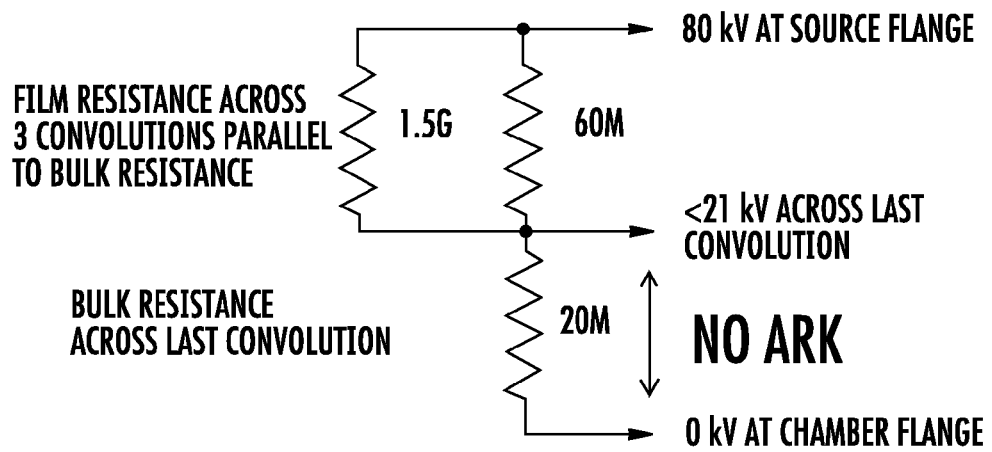
FIG. 4 is a circuit diagram to illustrate characteristics of a source bushing consistent with the present disclosure.

Turning to FIG. 4, a circuit diagram illustrates an electric model of a source bushing, e.g., source bushings 112 or 301, having a bulk material with a limited conductivity consistent with an embodiment of the disclosure. Like FIG. 1, this circuit diagram assumes an extraction voltage of 80 kV. Furthermore, it assumes that the tungsten film extends across 3 convolutions. Finally, it assumes that the bulk resistance exists across the last convolution. However, in contrast to the circuit diagram of FIG. 1, less than 21 kV (as opposed to >74 kV) is applied across the uncoated portion of the source bushing. In other words, point 711 would be at a potential of 21 kV, rather than the 74 kV as occurs with conventional bushings. Hence arcing across the source bushing may be limited and/or prevented.

Figure 5:
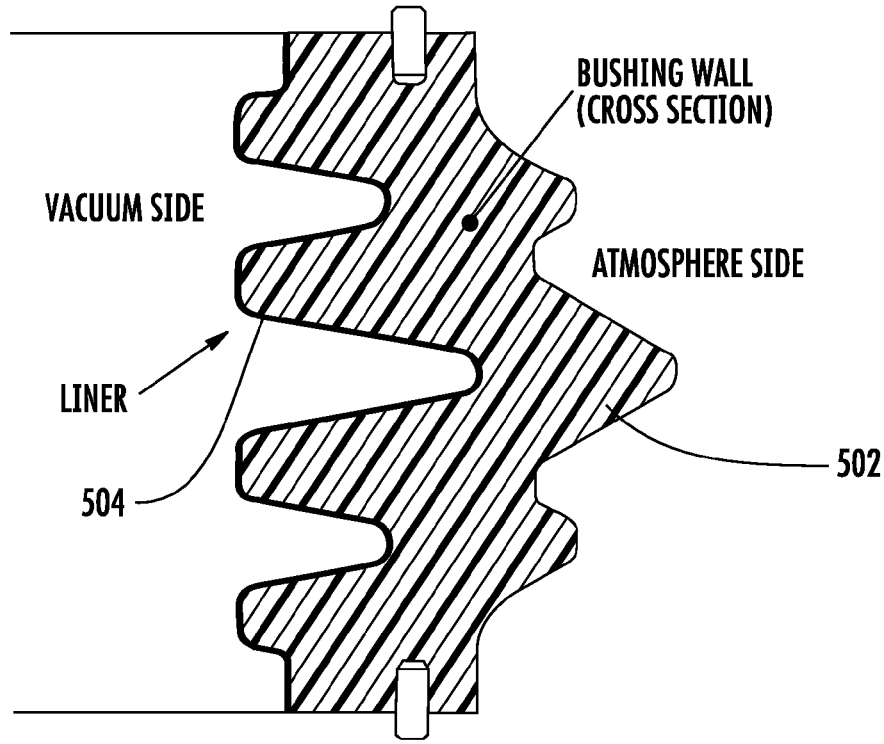
FIG. 5 is a cross sectional view of another embodiment of a source bushing consistent with the present disclosure.

Turning to FIG. 5, a cross sectional view of a source bushing 502 consistent with a second embodiment is illustrated. The source bushing 502 may have a conductive liner 504 affixed to the vacuum side of the source bushing 502 where the film forms. In contrast to the first embodiment of a bulk conductive bushing, the bulk material of the bushing of the second embodiment remains non-conductive. The conductive liner 504 effectively controls the electrical potential distribution so that the model of the potential distribution is similar to that of FIG. 4.

In one embodiment, the conductive liner 504 may be cast from a material with a much lower bulk resistance than that used for casting a fully conductive bushing, due to the difference in thickness. The thickness of the cast liner can be varied to more finely adjust electrical properties of the bushing and shape the electrical field. Materials and additives as described above can be used to create this liner. An advantage of the liner may be that it is feasible to work with materials of lower bulk resistance or more expensive materials. This increases the number of material choices. Compared to a thin surface film (e.g. CVD deposits), a liner is thicker (e.g. ¼"), so it can be cleaned easily by abrasive methods.

An alternative method to create the conductive liner 504 is to expose the bushing to $WF_6$ gas, a plasma process, or a chemical vapor deposition (CVD) process that forms a tungsten film from end to end with controlled thickness. The Tungsten film functions as a thin-film resistor that stabilizes the potential across the bushing. In some embodiments, the resistance of the resulting tungsten film may be too low. In these scenarios, plasma or CVD can create higher resistance by combining materials, such as tungsten silicide. For example, mixing $WF_6$ with silane or dichlorosilane will create a tungsten silicide film.

Having reduced the overall bulk resistance of the source bushing allows film formation to occur without impacting the performance of the machine. As described in conjunction with FIG. 7, the film starts forming on the source bushing near the high voltage end and migrates toward the grounded component. This behavior will still occur with the new bushing. However, when the film reaches point 711, the potential is much lower, and therefore will not arc to the shield 703 or grounded component 702. Since arcing does not occur, the ion implanter remains functional. As the implanter continues to be used, the film continues growing, until it covers the entire inner surface of the bushing.

Once the film, such as tungsten film, has grown across the entire source bushing, it may add to stability of the electrical potential, even if it has a gradient. The tungsten film thickness growth may be self-limiting since metallic tungsten does not react with $WF_6$ near room temperature. Thus, once the bushing has been covered with tungsten, it resists further interaction with the $WF_6$ gas. Under favorable conditions (extraction potential low compared to bushing design potential), the tungsten film can grow to a homogeneous thickness while the bushing stabilizes the potential during growth. This may then give the source bushing an indefinite life.

FIG. 6 shows a generalized circuit diagram in accordance with the disclosure. In this circuit, the source bushing is used to couple two components, where one of the components is operating at a voltage of $V_{ext}$ while the second is operating at ground potential. Other voltages may also possible. For example, the second component may be at a voltage other than ground. This circuit assumes that the voltage difference between the two components is $V_{ext}$. In addition, the source bushing has an overall resistance of X, of which nX (where n is less than 1) is in is covered with the tungsten film. Furthermore, the tungsten film has a resistance of Y.

Assuming no other elements, the voltage at the uncoated source bushing ($V_p$) can be given by:

$$V_p = V_{ext} \cdot \frac{nX^2(1-n) + XY(1-n)}{nX^2(1-n) + XY}$$

In looking at this equation, it is clear that if Y is small relative to X, the expression tends toward:

$$V_p = V_{ext} \cdot \frac{nX^2(1-n)}{nX^2(1-n)} = V_{ext}$$

In other words, the entire potential difference appears at the uncoated bushing, since the film effectively negates the inherent resistance of the bushing. This is the situation that exists in conventional bushings. In contrast, if X is small relative to Y, the expression tends toward:

$$V_p = V_{ext} \cdot \frac{XY(1-n)}{XY} = V_{ext} \cdot (1-n)$$

In this case, the effect of the film is small, such that its presence does not change the fundamental voltage divider. Thus, by varying the relationship between X and Y, it is possible to regulate the maximum voltage that is applied to the uncoated bushing. Since the resistance of the tungsten film cannot be easily affected, the resistance changes must occur to the source bushing. Thus, decreasing the resistance of the bushing, by either adding additives to increase its conductivity or by applying a conductive coating to it, relative to the resistance of the film, it is possible to negate the effect of the conductive film that is deposited on the source bushing. The maximum allowable resistance of the source bushing can be determined based on the maximum electrical potential that the uncoated bushing can withstand without breaking down. The minimum allowable resistance of the source bushing is based on the maximum amount of excess current that can be supplied by the extraction voltage supply, as lower resistance values imply higher currents.

As an example, assume that point 711 may be at a voltage of 40 kV without any arcing occurring. Also assume that point 711 is located in a position such that 75% of the bushing gets coated in order to reach point 711. Furthermore, assume that the tungsten has a resistance of 1.5 GΩ and the voltage difference between the ion implanter and the second component is 80 kV. Substituting these values into the equation above, it can be determined that a bulk resistance of 4 GΩ would allow point 711 to be at 40 kV. Therefore, the bulk resistance of the source bushing can be no greater than 4 GΩ. Its lower limit is set by the current capability of the power supply. In another example, if the maximum voltage without arcing were determined to be 30 kV, the bulk resistance must be no greater than 1.6 GΩ.

Thus, to eliminate arcing in this situation, a number of steps can be performed. First, the position from which the arc emanates must be determined, as well as the opposite point to which the voltage arcs. There may be a plurality of possible arc paths that may be considered. Based on the length of these paths, and the medium through which the arc travels (air, vacuum, etc), a determination of the maximum voltage difference between the points on the source bushing and the component 702 can be made. Additionally, the resistance of the film from the ion source 700 to the position from which the arc emanates can be estimated, calculated or measured empirically. Similarly, the percentage of the source bushing that is coated by the film can also be estimated, calculated or measured empirically. Using these values, it is possible to calculate the maximum bulk resistance of the source bushing to eliminate arcing. Once the maximum bulk resistance is determined, the proper additive and its concentration can be calculated, thereby allowing the creation of a source bushing that eliminates arcing. Alternatively, this maximum resistance value can be used to determine the material to be used to construct the conductive liner as described in FIG. 5.

Accordingly, there has been provided a source bushing to compensate for the growth of a tungsten film thereon to minimize arcing and electrical breakdown of the source bushing. Furthermore, there has been provided a method for determining the bulk resistance of a source bushing such that it can operate within the desired environment.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An ion implanting apparatus, comprising:
    an ion source, operating at a first electrical potential;
    a second component, operating at a second electrical potential; and
    an insulator, coupling said ion source and said second component, having a bulk resistance of less than 4 GΩ.

2. The ion implanting apparatus of claim 1, wherein said resistance value is modified by applying additives to said bulk material.

3. The ion implanting apparatus of claim 1, wherein said additive is selected from the group consisting of silver, graphite powder, doped alumina, semiconductor materials, semi-insulator materials and organo-metallic material.

4. The ion implanting apparatus of claim 1, wherein said resistance value is modified by applying a conductive layer to said insulator.

5. The ion implanting apparatus of claim 4, wherein said conductive layer is applied using CVD.

6. The ion implanting apparatus of claim 1, wherein said conductive layer is molded onto said bulk material.

7. The ion implanting apparatus of claim 1, wherein said second component is a mounting flange or vacuum chamber, operating at ground potential.

8. A method of eliminating arcing within an ion implanting apparatus, said apparatus having an ion source, operating at a first electrical potential, a second component, operating at a second electrical potential, and an insulator, comprising a bulk material, having a vacuum side and an atmospheric side, said insulator coupling said ion source and said second component, wherein a portion of said vacuum side of said insulator becomes coated by a film, and a second portion of said vacuum side is uncoated, said method comprising:
    determining a location on said bushing where arcing occurs;
    determining a resistance of said film from said ion source to said arcing location;
    determining a maximum voltage at which arcing does not occur; and
    calculating a maximum resistance of said insulator, based on said determined values; and
    modifying said bulk material of said insulator so as to achieve a resistance less than said maximum calculated resistance.

9. The method of claim 8, further comprising adding an additive to said bulk material.

10. The method of claim 9, wherein said additive is selected from the group consisting of silver, graphite powder, doped alumina, semiconductor materials, semi-insulator materials and organo-metallic material.

11. The method of claim 8, further comprising applying a conductive layer to said insulator.

12. The method of claim 11, wherein said conductive layer is applied using CVD.

13. The method of claim 8, wherein said conductive layer is molded onto said bulk material.

* * * * *